United States Patent [19]

Scheraga

[11] Patent Number: 5,789,955
[45] Date of Patent: Aug. 4, 1998

[54] CURRENT SLEW RATE LIMITER

[75] Inventor: William J. Scheraga, Warwick, R.I.

[73] Assignee: Cherry Semiconductor Corporation, East Greenwich, R.I.

[21] Appl. No.: 729,628

[22] Filed: Oct. 10, 1996

Related U.S. Application Data

[60] Provisional application No. 60/005,168 Oct. 13, 1995.

[51] Int. Cl.[6] ........................................ H03K 5/12
[52] U.S. Cl. ................... 327/170; 327/376; 327/380
[58] Field of Search ............................ 326/89; 327/132, 327/133, 170, 374, 376, 377, 379, 380, 381, 387, 538

[56] References Cited

U.S. PATENT DOCUMENTS 5,371,415  12/1994  Dixon et al. ........................ 327/379

*Primary Examiner*—Timothy P. Callahan
*Assistant Examiner*—Jeffrey Zweizig
*Attorney, Agent, or Firm*—Bromberg & Sunstein LLP

[57] ABSTRACT

A current slew rate limiter for limiting the rate at which current is applied to the base of an NPN output transistor. Current is applied to the output transistor base via a first output port of a current splitter. The current provided by the second output port of the current splitter is fed back to the input of the current splitter via an NPN current mirror and a PNP current mirror connected in series. A current limiting resistor is provided in at least one of the input and output circuits of the PNP current mirror to limit the maximum output current to the base of the NPN output transistor.

19 Claims, 3 Drawing Sheets

CURRENT SLEW RATE LIMITER

The present application claims priority from U.S. provisional application Ser. No. 60/005,168, filed Oct. 13, 1995, which is incorporated herein by reference.

TECHNICAL FIELD

The present invention is directed to a circuit for limiting the rate of increase of current supplied to a circuit node, in particular, a slew rate limiter for an NPN transistor driver.

BACKGROUND OF THE INVENTION

In a standard design output stage shown in FIG. 1, the NPN output transistor, NOUT, is driven by the current $I_b$ flowing through RLIMIT. Base current $I_B$ of output transistor NOUT must be high enough to drive NOUT into saturation and equals: [(VSUPPLY-VBE(NOUT))/RLIMIT], and is applied with no delay once control transistor NCONTROL is turned off. This causes collector current $I_c$ of NOUT to increase very quickly. When a wire is connected to the collector of NOUT, this fast change in voltage may cause radiated electromagnetic (E-M) energy. The long wire effectively acts as a transmitting antenna. The radiated E-M energy can cause interference with radio frequency equipment in the vicinity of the circuit. The collector current of transistor NOUT may rise in as short a time as about 50 nanoseconds from 0 to a maximum value. In order to reduce undesirable radiated emissions, it is necessary to increase this rise time significantly.

Previous solutions for slowing the rise time of such an NPN driver have generally relied on capacitors and current sources to generate a voltage wave form with controlled rise and/or fall times. In addition, for MOS circuits, the characteristics of those transistors could be used to generate slow rise and/or fall times. For a strictly bipolar fabrication process, the ability to avoid capacitors to generate the controlled waveform allows either fewer mask steps or the elimination of significant die area for a junction capacitor.

SUMMARY OF THE INVENTION

The circuitry of the invention slows down the rate of turn-on for an NPN driver by controlling the level of base drive current. The circuit splits an initial limited input current and provides only a portion to drive the NPN transistor. The other portion of the input current is morrired, and optionally multiplied or divided, and then added back into the input current. The added current is ultimately limited by a resistor to some maximum value. The circuit includes a PNP current splitter and a PNP current mirror. Because PNPs are relatively slow, the rate of NPN base current buildup is slow enough to cause the NPN output current, $(I_b \times \beta(NPN))$, where $\beta(NPN)$ is the current amplification factor of NOUT to increase at a rate which is sufficiently slow as to make negligible the electromagnetic emissions from any wire attached to the output. This goal may be achieved, using the present invention, without the use of capacitors.

In a preferred embodiment of the present invention, there is provided a slew rate limiter for limiting the rate of increase of current supplied to a node of a circuit. The slew rate limiter has a supply port for receiving a positive power supply voltage. A first transistor switch grounds the node in response to a control signal applied to the base of the transistor switch. A current splitter is provided which has a first output terminal for driving the node, a second output terminal, and an input terminal coupled via a series resistor to the supply port. A second transistor switch, having a base coupled in parallel to the base of the first transistor switch, grounds the input terminal of the current splitter in response to the control signal. The slew rate limiter also has an NPN current mirror with an input terminal coupled to the second output terminal of the current splitter, an output, and a grounded common, as well as a PNP current mirror having an input terminal coupled to the output terminal of the NPN current mirror, an output terminal coupled to the input terminal of the current splitter, and a common terminal coupled to the supply port. Finally, the slew rate limiter has at least one resistor coupled in series with at least one of the terminals of the PNP current mirror.

DETAILED DESCRIPTION OF PREFERRED EMBODIMENTS

The purpose of this invention is to provide a current to a circuit node which current increases at a rate slow enough that electromagnetically radiated noise due to the change in current is negligible, even when the current is amplified by the amplification factor of a subsequent circuit element. A particular application is to an NPN transistor driver that increases in base current at a rate slow enough to make electromagnetically radiated noise due to the change in collector current negligible. In this application, the invention abates E-M radiation by causing the base current drive to the NPN transistor to increase at a controlled rate. This invention takes advantage of the low $F_t$(transition frequency) characteristics of PNP transistors built using standard processes known in the art for fabrication of bipolar devices.

Figure 2:
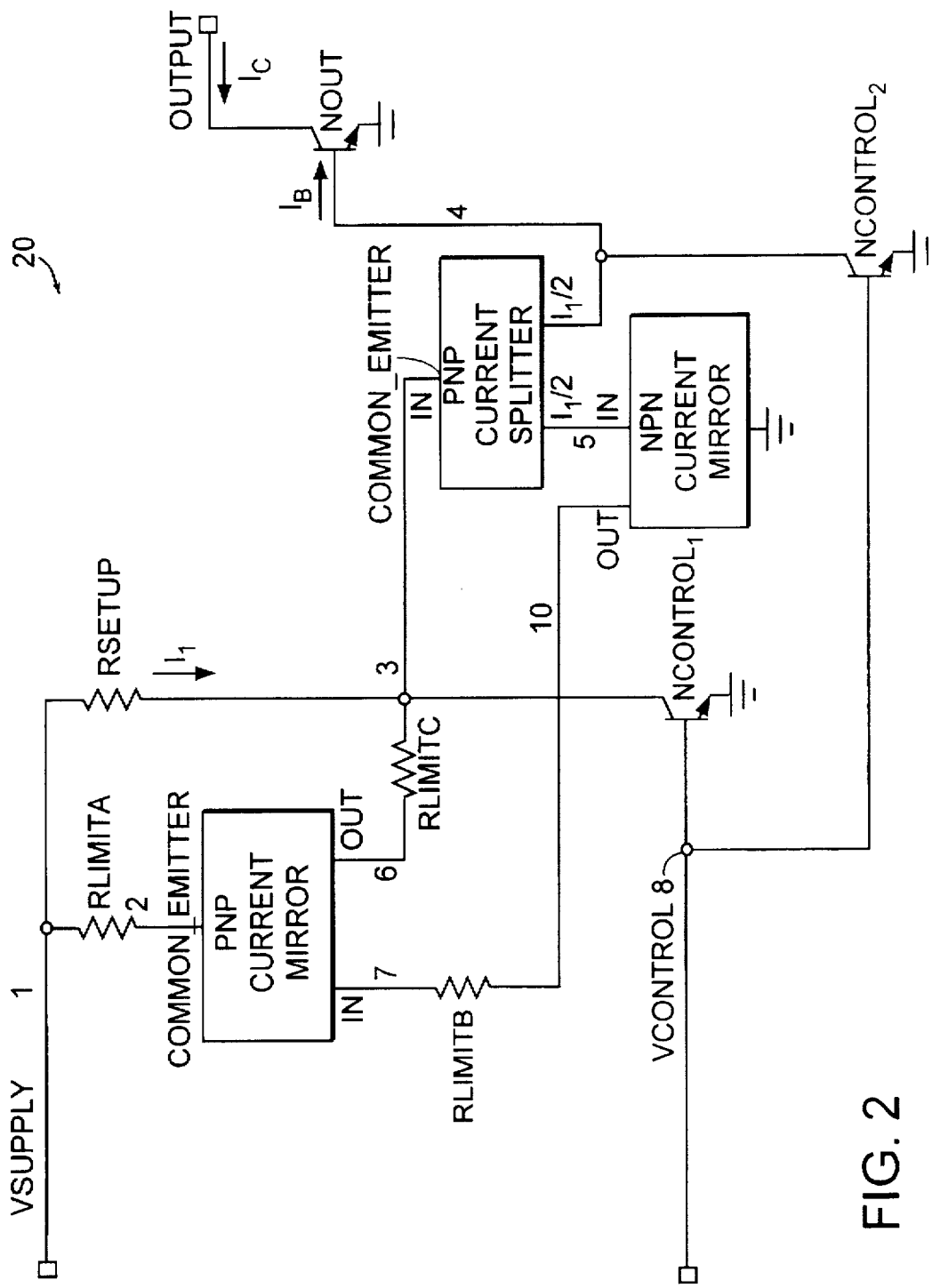
FIG. 2 is a block diagram of an NPN base current slew rate limiter circuit in accordance with an embodiment of the present invention.

An embodiment of the invention is described, initially, with reference to FIG. 2 which depicts a block diagram of a slew rate limiter circuit, designated generally by numeral 20. The circuit element, the current of which is limited by the invention, is shown, by way of example, as an output NPN transistor NOUT, and the current limited by the invention is the base current $I_b$ supplied to the base terminal of transistor NOUT. In other embodiments of the invention, the current supplied to any node of a circuit may be limited by the means taught in the invention.

In slew rate limiter circuit 20 of an embodiment of the invention, base current $I_B$ into the base terminal of output NPN transistor NOUT is applied, initially, at a small value and caused to increase at a steady rate. Base current $I_B$ is then multiplied by the current amplification factor of NOUT to generate collector current $I_C$, which increases slowly enough so that electromagnetically radiated noise is negligible for the application to which the circuit is being applied.

Referring further to FIG. 2, assume initially that the transistor switches NCONTROL$_1$ and NCONTROL$_2$ are both on. NCONTROL$_2$ shunts any current $I_B$ flowing in the base circuit of NOUT to ground, thereby keeping NOUT in the off state. Additionally, NCONTROL$_1$ shunts current $I_1$ flowing through resistor RSETUP to ground and prevents current from flowing in the slew rate limiter loop, described below, so that when NCONTROL$_1$ and NCONTROL$_2$ are switched off, to a non-shunting mode, current I$_B$ will begin to rise from an intial current value controlled by the value of resistor RSETUP.

The base of NOUT is connected to an output node 4 which corresponds to a first output terminal of PNP CURRENT SPLITTER. A second output 5 of PNP CURRENT SPLITTER is connected to the input port of NPN CURRENT MIRROR, while the common port of NPN CURRENT MIRROR is grounded. The output circuit of NPN CURRENT MIRROR is connected via resistor R$_{LIMITB}$ to the input port of PNP CURRENT MIRROR. The output port of PNP CURRENT MIRROR is connected via resistor R$_{LIMITC}$ to the input 3 of PNP CURRENT SPLITTER, while the common port of PNP CURRENT MIRROR is connected via resistor R$_{LIMITA}$ to the voltage supply port 1.

PNP CURRENT SPLITTER is a circuit, known in the art, which provides two output currents, each of which is some portion, a specified fraction,of the input current of the current splitter. During the "off" state, current flowing through RSETUP is shunted to ground via NCONTROL$_1$, so that no current flows into PNP CURRENT SPLITTER, and no current flows out of PNP CURRENT SPLITTER.

A current mirror is a circuit, known in the art, which has an input port, an output port, and a common port. The current flowing between the common port and the output port is a specified multiple of the current between the common port and an input port. The specified ratio of output current to input current is determined by the design of the current mirror. Thus, with no current flowing out of PNP CURRENT SPLITTER, NPN CURRENT MIRROR has no input current, and, consequently, provides no output current.

The flow of non-zero current I$_B$, and, particularly, switching the state of transistor NOUT, is initiated by turning off transistors NCONTROL$_1$ and NCONTROL$_2$ by means of a control signal VCONTROL applied at their respective bases, labeled point 8. Immediately, with transistors NCONTROL$_1$ and NCONTROL$_2$ switched into a non-shunting mode, current I$_1$, determined by the value of RSETUP, will begin to flow through RSETUP into the input of PNP CURRENT SPLITTER. The current into PNP CURRENT SPLITTER is split into two portions. In one embodiment, the PNP CURRENT SPLITTER is realized as a common PNP current mirror with a PNP transistor emitter area ratio of 1:1, though other realizations and other splitting ratios are within the scope of the invention. A fraction of current I$_1$, where, for purposes of describing the invention, the fraction is taken to be one half, flows into the base of NOUT, and the other portion of current I$_1$ flows into the IN terminal of NPN CURRENT MIRROR.

Only a fraction of the current which would flow into the base of NOUT using prior art circuitry actually flows into the base of NOUT in accordance with the invention. Two results of the lower current are: the collector current of NOUT is delayed, relative to prior art circuits, in turning on, and the growth in the collector current IC is slower, again, relative to prior art circuits. The delay and slow increase is due to the capacitance of the PNP components of the circuit, in series with series resistances, as discussed below.

The other portion of current from PNP CURRENT SPLITTER is used to generate a current proportioinal to itself as an input to a PNP CURRENT MIRROR. The PNP CURRENT MIRROR then mirrors this current and sums it with the current from RSETUP. PNP CURRENT MIRROR may also multiply this current by a specified factor, in alternative embodiments. Now, the current at the IN terminal of PNP CURRENT SPLITTER has been increased by 50% (assuming all mirror ratios are 1:1). The cycle then repeats, starting at this higher current level. The IN terminal of PNP CURRENT SPLITTER is also referred to as the "COMMON EMITTER input," as described below in relation to the circuit realization of the PNP CURRENT SPLITTER. In reality, the current at the COMMON EMITTER input does not increase as a 50% step function, but smoothly, since the PNP transistors in the current path respond to change relatively slowly. This "slowness" characteristic of the lateral PNP transistor is a result of the relatively wide base width of the transistor (as compared with the NPN transistor built by the same process). This characteristic is what is used in this invention to generate the reduced slew rate current.

Limiting resistors R$_{LIMITA}$, R$_{LIMITB}$, and R$_{LIMITC}$, whose locations in the circuit have been described, serve, in combination with the capcitance of the PNP transistors, to limit the rate of current build up. Only one resistor, which may be any one of the three resistors shown, needs to be used, though the block diagram shows all three. The value of resistance of each of the limiting resistors can easily be calculated by a person skilled in the art to obtain the desired rate of increase in drive current. In the embodiment of the invention described below with reference to FIG. 3, R$_{LIMITB}$, and R$_{LIMITC}$ are not provided and R$_{LIMITA}$ has a typical value of 5.6 KΩ.

In order to generate a current proportional to the portion of current from PNP CURRENT SPLITTER appearing at second output 5, this portion of the current is caused to flow into the input of NPN CURRENT MIRROR. The current flow into the input of NPN CURRENT MIRROR is mirrored and causes an equal current to be sunk by the OUT terminal of NPN CURRENT MIRROR. The output current 10 then is drawn out of the IN terminal of PNP CURRENT MIRROR. Referring now to the schematic of FIG. 3, the description of slew rate limiter 20 again begins by assuming that the VCONTROL line is low. The components denoted functionally in FIG. 2 are here shown in terms of explicit device realizations. Thus, PNP CURRENT SPLITTER is shown as two PNP bipolar devices, P3 and P4, with common emitters and common bases.

Similarly, NPN CURRENT MIRROR is shown as two NPN bipolar devices, N5 and N6, with common emitters and common bases. And PNP CURRENT MIRROR is shown as two PNP bipolar devices, P1 and P2, with common emitters and common bases. When the VCONTROL line is low, transistor switch N8 is off and transistors N7 and N4, which were referred to, above, as NCONTROL$_1$ and NCONTROL$_2$, respectively, are on, so that current I$_B$ is zero at the circuit node output, and transistor N1, is off. NCONTROL, and NCONTROL$_2$ are on by virtue of the current applied to their bases through resistors R3, R4, and R5. The state of the circuit at this point has all the current from series resistor R1, connected between voltage supply port 1 and input 3 of PNP CURRENT SPLITTER, being shunted to ground through N7. When the VCONTROL line is low, there is no current in the PNP CURRENT SPLITTER, P3 & P4, in the NPN CURRENT MIRROR, N5 & N6, or in the PNP CURRENT MIRROR, P1 & P2.

To start the supply of current I$_B$ to output node 4, and, thereby, to turn on output transistor N1, the VCONTROL line is brought high, turning on N8. This causes N4 and N7 to turn off.

The current flowing through R1 will now flow into the PNP CURRENT SPLITTER P3 & P4.

Transistor P3 has its base shorted to its collector and the emitters and bases of P3 and P4 are shorted together. In this arrangement, current flowing into the emitters of P3 and P4 will divide approximately in half (if the emitter area of each PNP is equal), with equal amounts flowing out of each collector. The half unit of current from the collector of P3 will flow into the base of N1, turning it on. The amount of current is of a low enough value so as to not drive the transistor into saturation, given a known load resistor REXT. The other half unit of current flows out of the collector of P4 and into the input of the NPN CURRENT MIRROR at the base-collector short of N5. This current is equally mirrored (assuming both N5 and N6 are of equal emitter areas, though other ratios may be achieved within the scope of the invention, as is well-known in the art) in the collector of N6. From the collector of N6, this half unit of current flows into the input of the P1-P2 PNP CURRENT MIRROR at the base-collector short of P2. This current mirror is configured to double the input current because the emitter area of P1 is twice that of P2. Thus, the current flowing out of the collector of P1 is a full unit of current. This current is added to the current flowing through R1. Now, there are two units of current flowing into the input of the PNP current splitter. The cycle continues and the current into the PNP current splitter continues to increase. The resistor R2 serves to limit the maximum current allowed to flow into the P1-P2 current mirror, and ultimately, the current at output node 4.

Figure 1:
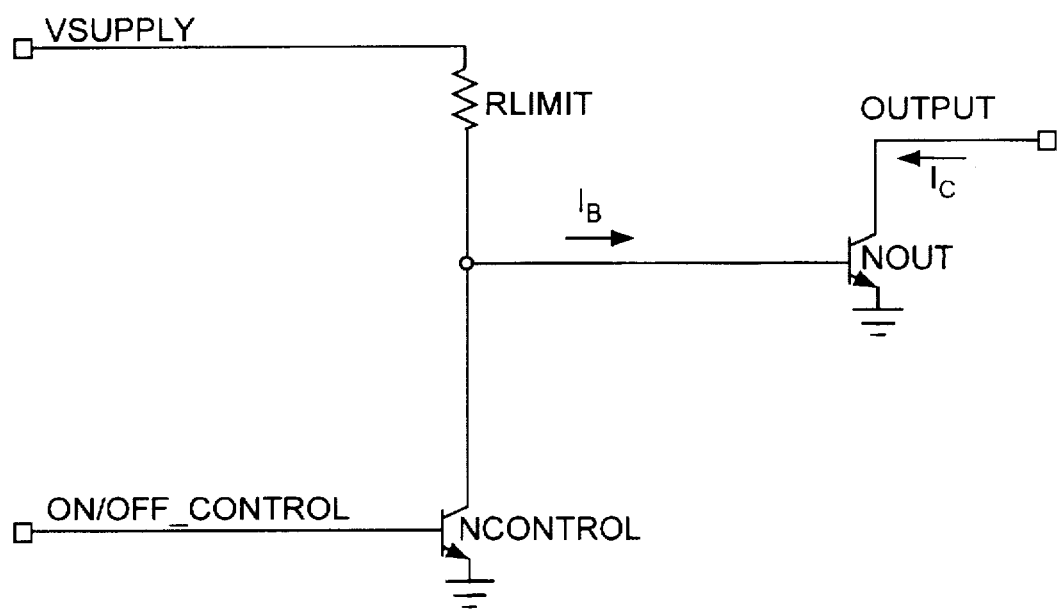
FIG. 1 is a schematic diagram of a prior art NPN base drive.

If there was not time delay in the flow of current, the current $I_B$ would appear to increase as a step function with time. However, the response time of the bipolar PNP transistor is relatively slow compared to the NPN transistor. It takes a finite amount of time for the current to increase when it flows through the PNP CURRENT SPLITTER and the PNP CURRENT MIRROR. Thus, the increase of current at output node 4, at the P3 collector output of the PNP CURRENT SPLITTER will increase as a slower function of time than a step function. By causing the path of the current that is used to drive the base of N1 to go through two different PNP stages (the PNP CURRENT SPLITTER and PNP CURRENT MIRROR), the increase of current is slowed when compared to the nominal circuit of FIG. 1. When this current flows into the base of N1, it is multiplied by a factor referred to as beta, and appears as collector current $I_C$ that is caused to flow through the output load resistor, REXT. Because the base current is increasing at a slower than nominal rate, the collector current is increasing at substantially the same rate. This will cause the voltage at the collector of N1 (the output), to decrease from 12 V to approximately zero over a longer period of time, reducing E-M emissions.

Figure 3:
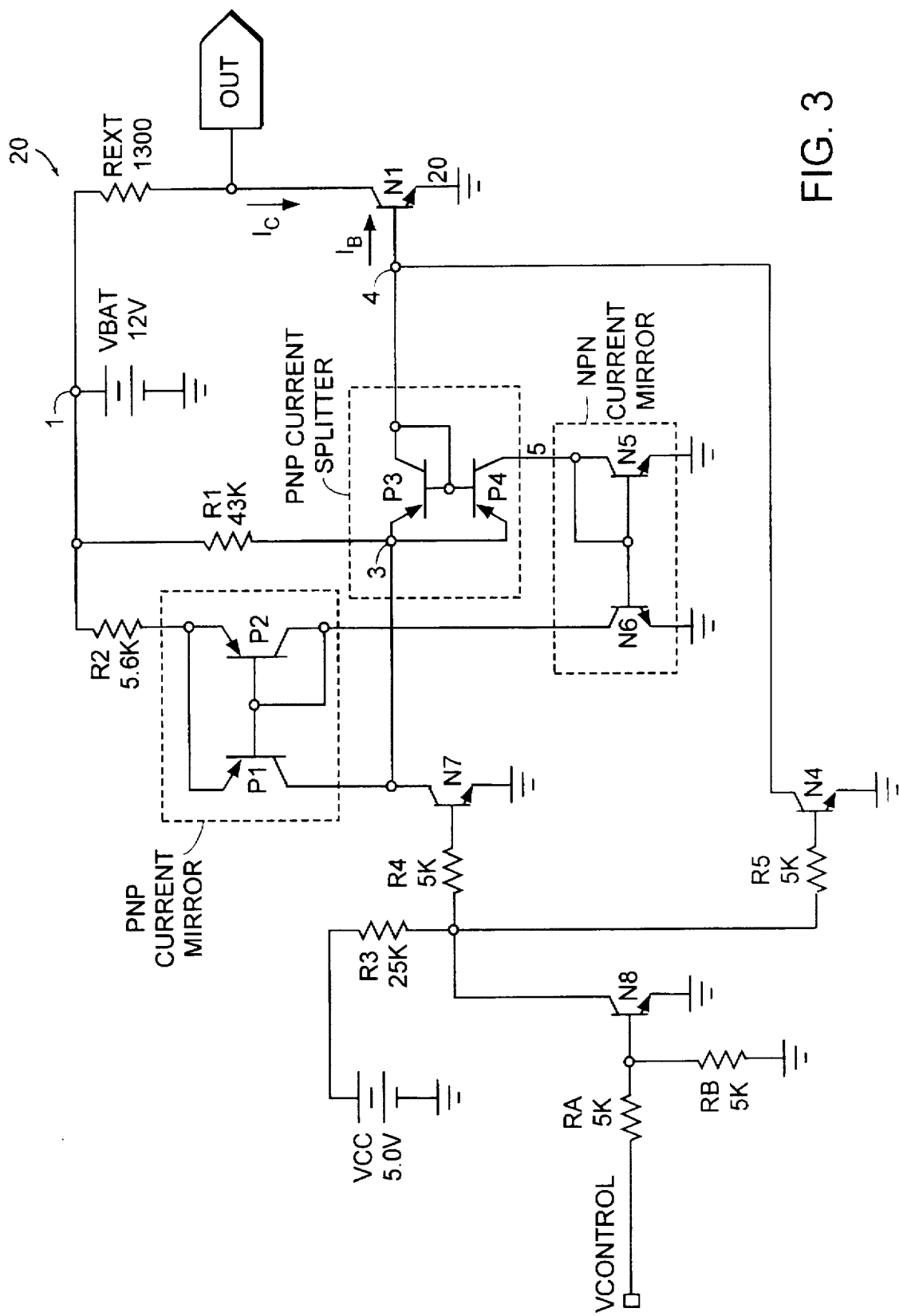
FIG. 3 is a schematic diagram of an NPN base current slew rate limiter circuit in accordance with an embodiment of the present invention.

In alternate embodiments of the invention, different types of current mirrors known in the art are employed in place of the simple ones described in reference to FIG. 3. For example, a Wilson current mirror or a buffered current mirror can be used for the current splitter or for either of the mirror circuits. The described embodiments of the inventions are intended to be merely exemplary and numerous variations and modifications will be apparent to those skilled in the art. All such variations and modifications are intended to be within the scope of the present invention as defined in the appended claims.

I claim:

1. A slew rate limiter for limiting the rate of increase of current supplied to an output node of a circuit comprising:

a supply port for receiving a positive power supply voltage;

a current splitter having an input terminal coupled to the supply port to receive an input current, a first output terminal for supplying a first portion of the input current to the output node, and a second output terminal for supplying a second portion of the input current;

a current shunt connected to the current splitter for selectively shunting current from the current splitter when in a shunting mode as opposed to a nonshunting mode; and a PNP current mirror having an input terminal for conducting a current proportional to the second portion of the input current, an output terminal coupled to the input terminal of the current splitter so as to add to the input current, and a common terminal coupled to the supply port wherein the first portion of the input current at the output node rises at a limited rate upon applying an input current to said current splitter and putting the current shunt in the nonshunting mode.

2. The slew rate limiter as set forth in claim 1 wherein the current splitter comprises a first PNP transistor having a base and a collector coupled to the first output terminal of the current splitter and a second PNP transistor having a collector coupled to the second output terminal of the current splitter and a base coupled to the base of the first PNP transistor, wherein the emitters of the first and second PNP transistors are coupled to the input terminal of the current splitter.

3. The slew rate limiter as set forth in claim 1 further comprising an NPN current mirror having an input terminal coupled to the second output terminal of the current splitter and an output terminal coupled to provide the input terminal of the PNP current mirror with the current proportional to the second portion of the input current.

4. The slew rate limiter as set forth in claim 3 wherein the NPN current mirror comprises a first NPN transistor having a base and a collector coupled to the input terminal of the NPN current mirror and a second NPN transistor having a collector coupled to the output terminal of the NPN current mirror and a base coupled to the base of the first NPN transistor, wherein the emitters of the first and second NPN transistors are coupled to ground.

5. The slew rate limiter as set forth in claim 1 wherein the PNP current mirror comprises a first PNP transistor having a base and a collector coupled to the input terminal of the PNP current mirror and a second PNP transistor having a collector coupled to the output terminal of the PNP current mirror and a base coupled to the base of the first PNP transistor, wherein the emitters of the first and second PNP transistors are coupled to the common terminal of the PNP current mirror.

6. The slew rate limiter as set forth in claim 1 wherein said current shunt includes an NPN transistor having a grounded emitter, a collector coupled to the output node, and a base responsive to a control signal.

7. The slew rate limiter as set forth in claim 1 wherein said current shunt includes a transistor switch having a base responsive to the control signal, a collector coupled to the input terminal of the current splitter and a grounded emitter.

8. The slew rate limiter as set forth in claim 1 further comprising a first resistor coupled between the input terminal of the current splitter and the supply port to limit an initial amount of input current.

9. The slew rate limiter as set forth in claim 8 further comprising a second resistor coupled in series with at least one of the terminals of the PNP current mirror to limit an amount of current added into the input current.

10. A slew rate limiter for limiting the rate of increase of current supplied to an output node of a circuit comprising:

a. a supply port for receiving a positive power supply voltage;

b. a first transistor switch for grounding the output node in response to a control signal applied to the base of the transistor switch;

c. a current splitter having a first output terminal for supplying current to the output node, a second output terminal, and an input terminal coupled via a series resistor to the supply port;

d. a second transistor switch, having a base coupled in parallel to the base of the first transistor switch, for grounding the input terminal of the current splitter in response to the control signal;

e. an NPN current mirror having an input terminal coupled to the second output terminal of the current splitter, an output, and a grounded common;

f. a PNP current mirror having an input terminal coupled to the output terminal of the NPN current mirror, an output terminal coupled to the input terminal of the current splitter, and a common terminal coupled to the supply port; and g. at least one resistor coupled in series with at least one of the terminals of the PNP current mirror.

11. The slew rate limiter as set forth in claim 10 wherein the current splitter comprises a first PNP transistor having a base and a collector coupled to the first output terminal of the current splitter and a second PNP transistor having a collector coupled to the second output terminal of the current splitter and a base coupled to the base of the first PNP transistor, wherein the emitters of the first and second PNP transistors are coupled to the input terminal of the current splitter.

12. The slew rate limiter as set forth in claim 10 wherein the NPN current mirror comprises a first NPN transistor having a base and a collector coupled to the input terminal of the current mirror and a second NPN transistor having a collector coupled to the output terminal of the current mirror and a base coupled to the base of the first NPN transistor, wherein the emitters of the first and second NPN transistors are coupled to the grounded common of the NPN current mirror.

13. The slew rate limiter as set forth in claim 10 wherein the PNP current mirror comprises a first PNP transistor having a base and a collector coupled to the input terminal of the PNP current mirror and a second PNP transistor having a collector coupled to the output terminal of the PNP current mirror and a base coupled to the base of the first PNP transistor, wherein the emitters of the first and second PNP transistors are coupled to the common terminal of the PNP current mirror.

14. The slew rate limiter as set forth in claim 10 wherein said first transistor switch includes an NPN transistor having a grounded emitter, a collector coupled to the output node, and a base coupled to receive a control voltage.

15. The slew rate limiter as set forth in claim 10 wherein said second transistor switch includes an NPN transistor having a grounded emitter, a collector coupled to the input terminal of the current splitter, and a base coupled to receive a control voltage.

16. A slew rate limiter for limiting the rate of increase of current supplied to an output node of a circuit comprising:

a. a supply port for receiving a positive power supply voltage;

b. a first transistor switch for grounding the output node in response to a control signal applied to the base of the transistor switch;

c. a current splitter having an input terminal coupled via a series resistor to the supply port, for supplying a first output current to the output node and a second output current;

d. a second transistor switch, having a base coupled in parallel to the base of the first transistor switch, for grounding the input terminal of the current splitter in response to the control signal;

e. an NPN current mirror having an input terminal for receiving the second output current of the current splitter, an output for sourcing an output current, and a grounded common;

f. a PNP current mirror having an input terminal for receiving the output current of the NPN current mirror, an output terminal coupled to the input terminal of the current splitter for supplying an output current, and a common terminal coupled to the supply port; and g. at least one resistor coupled in series with at least one of the terminals of the PNP current mirror.

17. A slew rate limiter according to claim 16, wherein the output current of the PNP current mirror equals twice the input current of the PNP current mirror.

18. A slew rate limiter according to claim 16, wherein the output current of the NPN current mirror equals the input current of the PNP current mirror.

19. A slew rate limiter according to claim 16, wherein the first and second output currents of the current splitter are of substantially equal magnitudes.

* * * * *